United States Patent
Touba et al.

(10) Patent No.: US 7,925,947 B1
(45) Date of Patent: Apr. 12, 2011

(54) X-CANCELING MULTIPLE-INPUT SIGNATURE REGISTER (MISR) FOR COMPACTING OUTPUT RESPONSES WITH UNKNOWNS

(75) Inventors: Nur A. Touba, Austin, TX (US); Laung-Terng (L.-T.) Wang, Sunnyvale, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 348 days.

(21) Appl. No.: 12/007,693

(22) Filed: Jan. 14, 2008

(51) Int. Cl.
*G01R 31/28* (2006.01)

(52) U.S. Cl. .......................... 714/732; 714/726

(58) Field of Classification Search ............... 714/729, 714/732
See application file for complete search history.

(56) References Cited

U.S. PATENT DOCUMENTS

| | | | |
|---|---|---|---|
| 7,185,253 B2 | 2/2007 | Mitra et al. | |
| 7,210,083 B2 * | 4/2007 | Grinchuk et al. | 714/732 |
| 7,222,277 B2 * | 5/2007 | Wang et al. | 714/726 |
| 7,370,254 B2 * | 5/2008 | Rajski et al. | 714/726 |
| 7,395,473 B2 * | 7/2008 | Cheng et al. | 714/729 |
| 7,437,640 B2 * | 10/2008 | Rajski et al. | 714/729 |
| 7,451,373 B2 * | 11/2008 | Poehl et al. | 714/740 |
| 7,610,527 B2 * | 10/2009 | Wang et al. | 714/724 |
| 2004/0230884 A1 | 11/2004 | Rajski et al. | |
| 2007/0113128 A1 * | 5/2007 | Gizdarski | 714/726 |

OTHER PUBLICATIONS

S. Mitra and K.S. Kim, "X-Compact: An Efficient Response Compaction Scheme" *IEEE Trans. On Computer-Aided Design*, vol. 23, No. 3, pp. 421-432, Mar. 2004.
N.A. Touba, "X-Canceling MISR—An X-Tolerant Methodology for Compacting Output Responses with Unknowns Using a MISR," *Proc. Of International Test Conference*, Paper 6.2, Oct. 23-25, 2007.
P. Wohl, J.A. Waicukauski, and S. Patel, "Scalable Selector Architecture for X-Tolerance Deterministic BIST," *Proc. Of Design Automation Conference*, pp. 934-939, 2004.

* cited by examiner

*Primary Examiner* — James C Kerveros
(74) *Attorney, Agent, or Firm* — Bacon & Thomas, PLLC

(57) ABSTRACT

A method and apparatus for compacting test responses containing unknown (X) values in a scan-based integrated circuit using an X-canceling multiple-input signature register (MISR) to produce a known (non-X) signature. The known (non-X) signature is obtained by selectively exclusive-ORing (XORing) together combinations of MISR bits which are linearly dependent in terms of the unknown (X) values using a selective XOR network.

20 Claims, 8 Drawing Sheets

$$M_1 = X_1$$

$$M_2 = X_1 \oplus X_2 \oplus X_3$$

$$M_3 = X_3$$

$$M_4 = X_1$$

$$M_5 = X_1 \oplus X_3$$

$$M_6 = X_3 \oplus X_4$$

$$\Rightarrow \quad \begin{array}{c} \phantom{\begin{bmatrix}1\end{bmatrix}} X_1 \ X_2 \ X_3 \ X_4 \\ \begin{bmatrix} 1 & 0 & 0 & 0 \\ 1 & 1 & 1 & 0 \\ 0 & 0 & 1 & 0 \\ 1 & 0 & 0 & 0 \\ 1 & 0 & 1 & 0 \\ 0 & 0 & 1 & 1 \end{bmatrix} \begin{array}{l} M_1 \\ M_2 \\ M_3 \\ M_4 \\ M_5 \\ M_6 \end{array} \end{array}$$

FIG. 5

$$\begin{bmatrix} \overset{X_1}{1} & \overset{X_2}{0} & \overset{X_3}{0} & \overset{X_4}{0} \\ 1 & 1 & 1 & 0 \\ 0 & 0 & 1 & 0 \\ 1 & 0 & 0 & 0 \\ 1 & 0 & 1 & 0 \\ 0 & 0 & 1 & 1 \end{bmatrix} \begin{matrix} M_1 \\ M_2 \\ M_3 \\ M_4 \\ M_5 \\ M_6 \end{matrix} \rightarrow \begin{bmatrix} \overset{X_1}{1} & \overset{X_2}{0} & \overset{X_3}{0} & \overset{X_4}{0} \\ 0 & 1 & 0 & 0 \\ 0 & 0 & 1 & 0 \\ 0 & 0 & 0 & 1 \\ 0 & 0 & 0 & 0 \\ 0 & 0 & 0 & 0 \end{bmatrix} \begin{matrix} M_1 \\ M_1 \oplus M_2 \oplus M_3 \\ M_3 \\ M_3 \oplus M_6 \\ M_1 \oplus M_3 \oplus M_5 \\ M_1 \oplus M_4 \end{matrix}$$

X-CANCELING MULTIPLE-INPUT SIGNATURE REGISTER (MISR) FOR COMPACTING OUTPUT RESPONSES WITH UNKNOWNS

FIELD OF THE INVENTION

The present invention generally relates to the field of scan-based design and test using design-for-test (DFT) techniques. Specifically, the present invention relates to the field of scan testing and test compression.

BACKGROUND

As integrated circuits increase in size and complexity, test compression is becoming a requirement for reducing test data volume and test application time. Test compression compresses the amount of both stimuli and response data that must be stored in a tester or automatic test equipment (ATE).

Test stimulus compression is done by adding a decompressor at the scan input side of the scan chains for decompressing n-input compressed test patterns stored in the tester to m-input decompressed test patterns for driving m internal scan chains during each scan shift cycle, where n<m. The decompressor can be a linear feedback shift register (LFSR) based finite-state machine or a combinational logic network using a multiplexer (MUX) network or exclusive-OR (XOR) network. When a combinational logic network is used, the decompressor is also referred to as a broadcaster.

Test response compaction is done by adding a compactor at the scan output side of the scan chains for compacting the test response. If the test response is deterministic and contains all known values, a simple approach of using a multiple-input signature register (MISR) can be used to compress the entire output response down to a single final signature. However, in many cases the output response may contain a number of unknown (X) values that cannot be predicted ahead of time. There are many sources of X's, for example uninitialized memory, bus contention, non-scan latches and flip-flops, floating tri-states, multi-cycle paths, cross-clock-domain logic, etc. These X values corrupt the final signature in a MISR making it unpredictable and hence unusable. This is a major issue for test compression and BIST. A number of schemes have been developed to deal with the problem of X's in the output response.

One approach is to modify the circuit-under-test (CUT) in the design phase to eliminate the sources of X values so that the output response contains only known values. This is often called X-bounding or X-blocking. It involves inserting design-for-testability (DFT) hardware into the CUT to prevent X's from propagating to scan cells. However, some X's, e.g., those due to races, may become known very late in the design or manufacturing stage, and thus cannot be eliminated. Also, in some cases, it is not desirable to modify the design, e.g., when using legacy designs, macrocells, hard cores, etc.

Another approach, which does not require modifying the CUT, is to use X-masking. This involves masking out the X's at the input to the compactor. Mask data is required to specify which scan chain outputs should be masked in each clock cycle. A number of techniques have been developed for designing the masking hardware and compressing the amount of mask data that is required including Barnhart et al. (2001), Wohl et al. (2001, 2003, 2004), Pomeranz et al. (2002), Chickermane et al. (2004), Volkerink et al. (2005), Chao et al. (2005), Tang et al. (2006), Rajski et al. (2006), and Wang et al. (2007). In most cases, the resolution of the masking is reduced in order to keep the amount of mask data at reasonable levels (e.g., an entire scan chain may be masked or an entire scan slice may be masked). This results in some non-X values also getting masked which reduces observability and may impact the coverage, particularly for unmodeled faults.

A third approach is to use an X-tolerant compactor that can compact an output stream that contains X's. This is an attractive approach as it eliminates the need for X-masking. In U.S. Pat. No. 7,185,253 and also published in Mitra et al. (2004), an X-tolerant compactor, called X-Compact, is described which consists of a combinational circuit that compacts n scan chains outputs in each clock cycle down to m bits which are compared with the expected response on the tester. It is illustrated in FIG. 1. When X's arrive at the input of the compactor, they propagate to some of the m output bits thereby corrupting them. The corrupted output bits are masked (i.e., ignored) by the tester. The key idea in X-Compact is to design the combinational circuit so that in the presence of a limited number of X inputs, enough of the compacted outputs are left uncorrupted such that errors on the non-X inputs can still be detected. The compaction ratio of n to m depends on the number of X's that are guaranteed to be tolerated. To maximize the compaction ratio, typically only one X would be guaranteed to be tolerated per clock cycle.

In U.S. patent application Ser. No. 10/778,950 (2004) and also published in Rajski et al. (2005), an X-tolerant compactor, called a convolutional compactor, is described. It uses a combinational compactor whose outputs are XORed into different stages of multiple shift registers. It is illustrated in FIG. 2. Each compacted output bit is thus a function of scan chain outputs across a window of consecutive clock cycles. A convolutional compactor allows tradeoffs in terms of the compaction ratio versus the number of X's that can be tolerated across a window of clock cycles.

Mitra et al. (2004) at the IEEE International Test Conference describes an X-tolerant multiple-input signature register (MISR) approach that is based on stochastic coding. It is illustrated in FIG. 3. Based on the probability of X's in the output stream, a weighted linear combination of scan chain outputs is fed to each MISR input. The weight logic is designed so as to minimize the expected number of bits in the MISR that get corrupted by X's. The corrupted bits in the MISR are masked on the tester while the non-corrupted bits are compared with the fault-free signature. The error coverage is probabilistic and will vary depending on the distribution of X's in the output stream. Error coverage can be improved by using more intermediate signatures or running the test multiple times with different linear combinations. The overhead scales with the product of the MISR size and number of scan chains and can be reduced by using multiple local MISRs. The main drawback of this approach is the need for a large number of intermediate MISR signatures and/or large area overhead in order to achieve high error coverage.

An object of the present invention is to provide an improved and more efficient X-tolerant scheme for compacting output streams using a Misr.

SUMMARY OF INVENTION

The present invention, as suggested in the paper published by Touba (2007) at the International Test Conference, is an X-tolerant output compaction scheme that cancels out X's in a MISR signature. It allows any number of scan chain outputs containing any distribution of X's to be compacted with a conventional MISR of any size augmented with a selective XOR network. The overhead scales linearly with the size of the MISR. For an m-bit MISR, k X's present anywhere in the output stream can be tolerated with error detection capability equivalent to using an m-k bit MISR with no unknowns.

In the present invention, combinations of bits in the MISR signature which are linearly dependent in terms of the X's are identified and XORed together to cancel out all the X's thereby yielding deterministic values that are invariant of what the final values of the X's end up being during the test. If these linearly dependent combinations of MISR bits mismatch with their fault-free values, then an error is detected. Errors in approximately half of the output response bits propagate to each linear dependent combination of the MISR bits. So checking q such combinations provides an error coverage of approximately $1-2^{-q}$. Thus checking 7 such combinations will give an error coverage of over 99%, and checking 16 such combinations would give an error coverage of 99.998% equivalent to using a 16 bit MISR on an output sequence with no unknowns.

In the present invention, the MISR bit combinations are checked using a selective XOR network which requires very little area overhead and whose design is independent of the circuit-under-test (CUT). In one embodiment of the present invention, the X-canceled outputs coming from the selective XOR network can themselves be compacted in a separate MISR such that no tester channels need to be used to transfer data back to the tester during the test session. This is especially attractive for multi-site testing where broadcasting channels from the tester to all devices-under-test (DUTs) is inexpensive, but bringing data from each individual DUT back to the tester is costly.

The foregoing and additional objects, features and advantages of the invention will become more apparent from the following detailed description, which proceeds with references to the following drawings.

THE BRIEF DESCRIPTION OF DRAWINGS

FIG. 5 is the X dependence of the MISR in FIG. 4;

FIG. 6 shows the matrix in FIG. 5 after Gauss-Jordan Reduction has been performed;

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
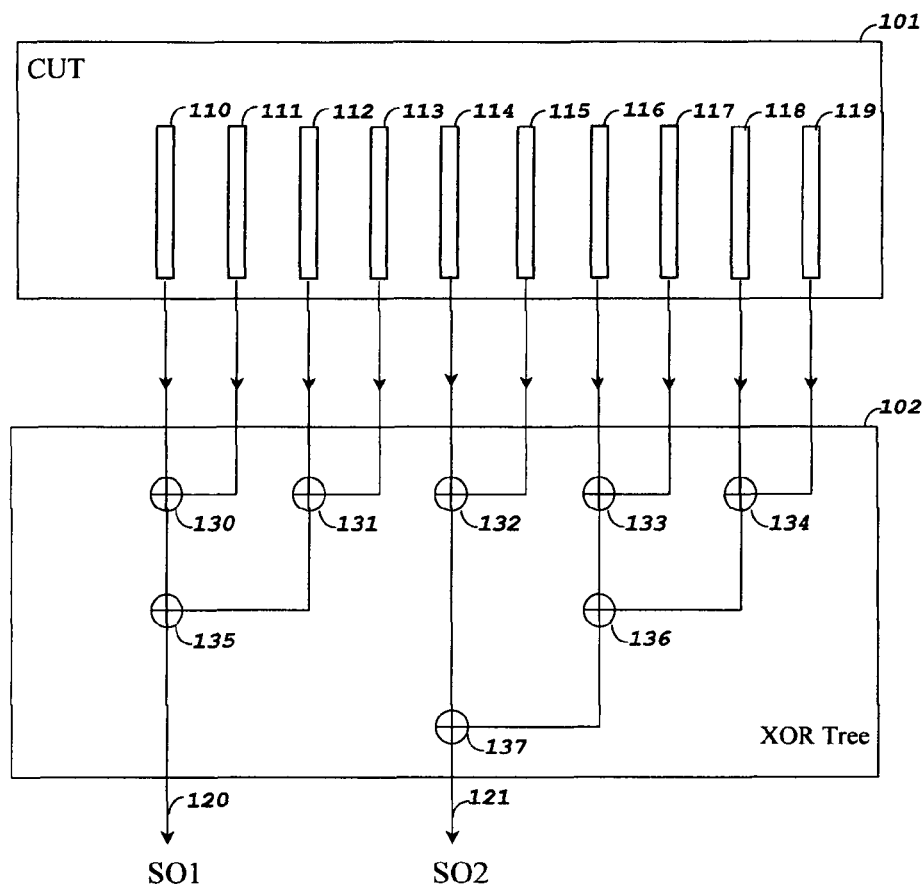
FIG. 1 is a circuit diagram of a prior art system using a space compactor built with an exclusive-OR (XOR) tree.

FIG. 1 shows a circuit diagram of a prior art system that includes multiple scan chains 110-119 in a circuit-under-test (CUT) 101 and a space compactor built with an exclusive-OR (XOR) tree 130-137. The outputs of multiple scan chains 110-119 feed to the space compactor 102 built with XOR gates 130-137. The results from the space compactor become compressed test responses SO1-SO2 120-121, which are then compared with expected test responses to determine the pass/fail status of the CUT 101.

Figure 2:
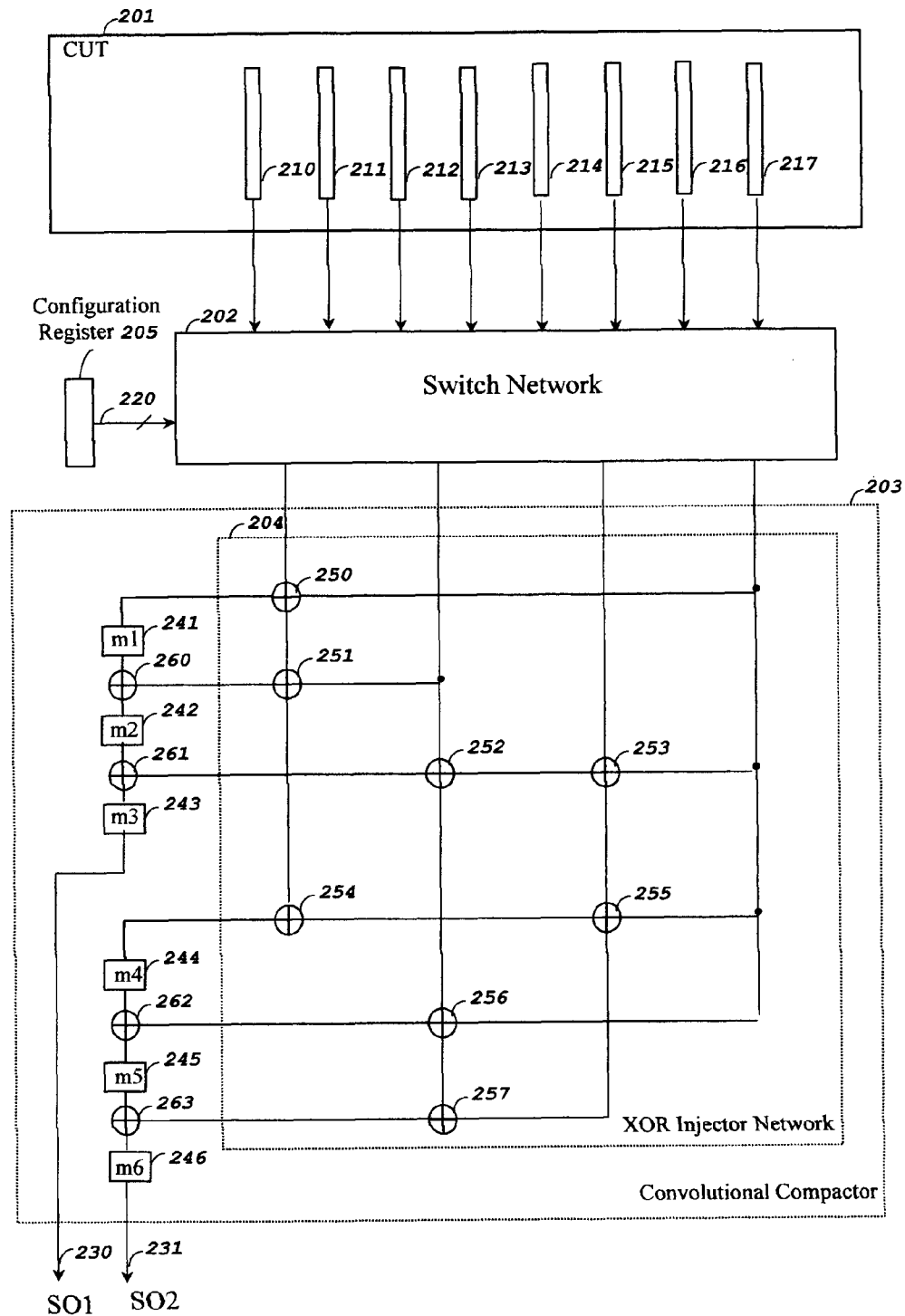
FIG. 2 is a circuit diagram of a prior art system using a convolutional compactor with a switch network.

FIG. 2 shows a circuit diagram of a prior art system that includes multiple scan chains 210-217 in a circuit-under-test (CUT) 201 and a convolutional compactor 203. The outputs of multiple scan chains 210-217 feed to the convolutional compactor 203 through a switch network 202. The convolutional compactor 203 comprises an XOR injector network 204 and storage elements (m1-m6) 241-246. The XOR injector network 204 comprises XOR gates 250-257. The switch network 202 selectively configures the interconnection between the scan chain outputs and inputs to the convolutional compactor 203. The switch network 202 is controlled by a configuration register 205. The results from the convolutional compactor 203 become compressed test responses SO1-SO2 230-231, which are then compared with expected test responses to determine the pass/fail status of the CUT 201.

Figure 3:
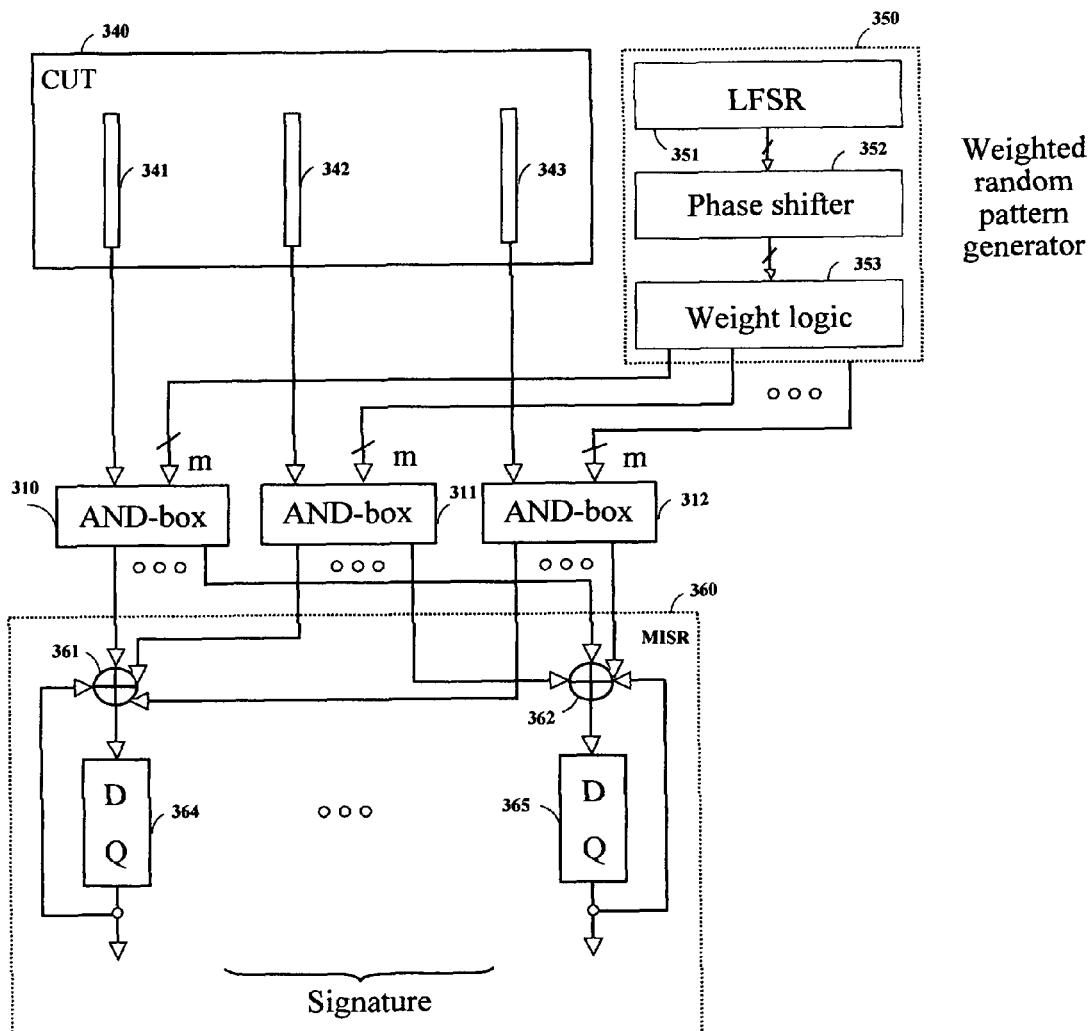
FIG. 3 is a circuit diagram of a prior art system using an X-tolerant MISR based on stochastic coding.

FIG. 3 shows a circuit diagram of a prior art X-tolerant MISR that includes a weighted random pattern generator 350, multiple scan chains 341-343 in a circuit-under-test (CUT) 340, a set of AND gates (AND-box) 310-312 for masking, and a MISR 360. The outputs of multiple scan chains 341-343 are masked using the AND gates 310-312 and then fed into the MISR 360. The MISR consists of XOR gates 361-362 and D flip-flops 364-365. The masking is controlled by the weighted random pattern generator 350. The weighted random pattern generator 350 consists of a linear feedback shift register (LFSR) 351, a phase shifter 352, and weight logic 353. The weight logic 353 is designed so as to minimize the expected number of bits in the MISR 360 that gets corrupted by X's. The signature generated in the MISR 360 is periodically shifted out to the tester. The tester is programmed to compare only the non-corrupted MISR bits with the expected test responses to determine the pass/fail status of the CUT 340.

Figure 4:
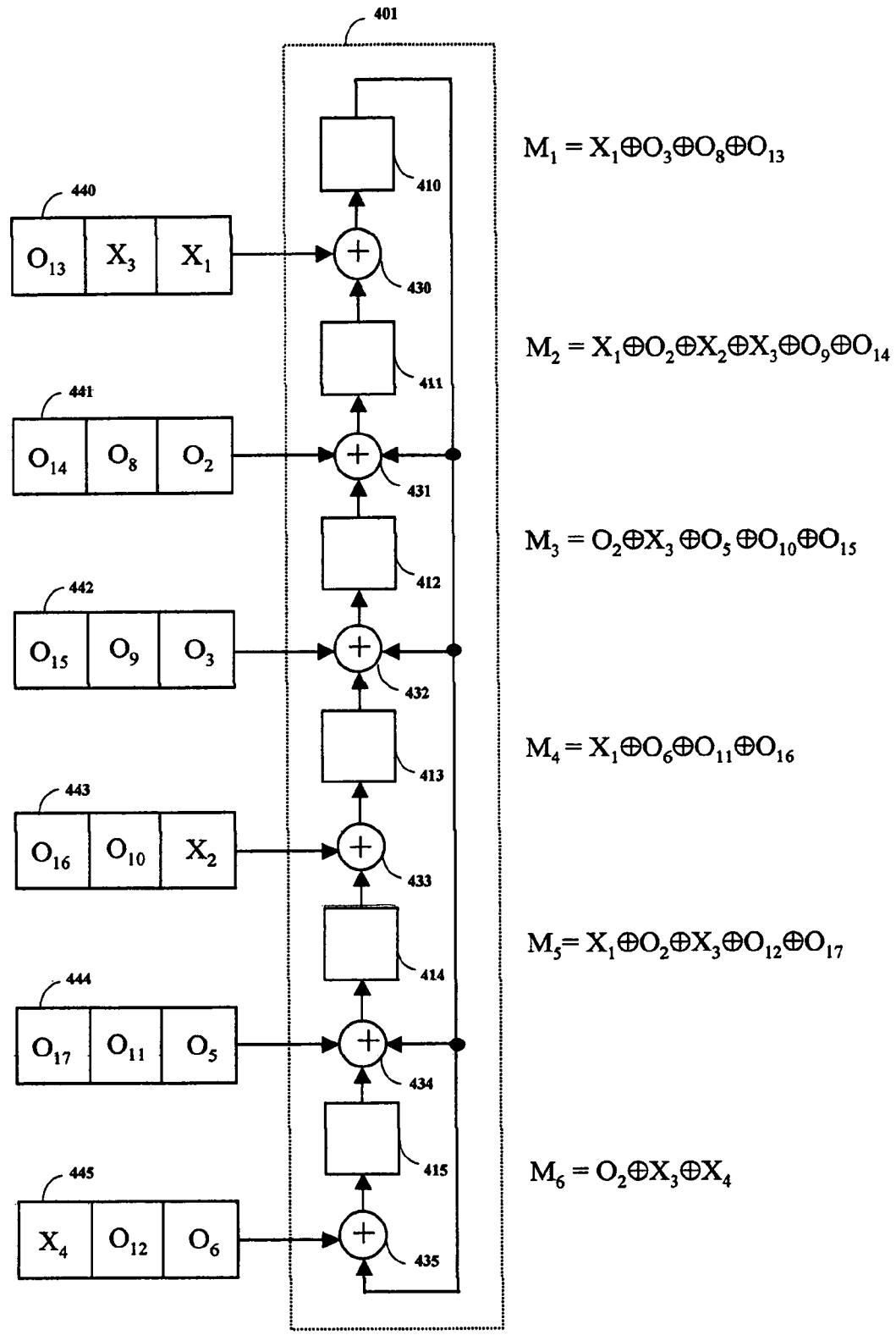
FIG. 4 is a circuit diagram of a conventional MISR and its corresponding linear equations.

FIG. 4 shows an example of compacting output response using a conventional MISR 401. The MISR 401 consists of a set of XOR gates 430-435 and a set of D flip-flops 410-415. The output response captured in the scan chains 440-445 is shifted into the MISR 401 to generate a signature. The signature is represented by a symbol $<M_1 M_2 M_3 M_4 M_5 M_6>$, where $M_i$ ($1<=i<=6$) is the output value of the $i^{th}$ D flip-flop 410-415. Since a MISR is a linear circuit, each bit in the signature generated in the MISR is equal to the XOR of the values captured in the D flip-flops. This is illustrated in FIG. 4 where the value captured in each D flip-flop is represented by a symbol, and the value of each MISR bit after compacting the output response is expressed as a linear equation in terms of the symbols. For example, the final value of the top bit of the MISR 401 will be equal to $X_1 \oplus O_3 \oplus O_8 \oplus O_{13}$. The linear equations for the MISR can be obtained through symbolic simulation of the MISR where the MISR is simulated cycle by cycle, and the contents of each MISR bit is computed in term of the symbols representing the value captured by each scan cell.

For the example in FIG. 4, assume each symbol $X_i$ has an X value and each symbol $O_i$ has a non-X value. In this case, the MISR 401 is compacting four X's, and the X dependence of the MISR bits is as shown in FIG. 5. The linear equations for each MISR bit can be represented as a matrix where each row corresponds to a MISR bit and each column corresponds to an X. Each entry in the matrix is a 1 if the MISR bit corresponding to the row depends on the X corresponding to the column. This is illustrated in FIG. 5. For example, in FIG. 5, the second row of the matrix corresponds to $M_2$, and the 1's in the first three columns indicate dependence on $X_1$, $X_2$, and $X_3$, respectively. If the number of X's is less than the size of the MISR, then there are more rows than columns and hence some combinations of rows are guaranteed to be linearly dependent. Gauss-Jordan elimination can be used to identify the linearly dependent row combinations. Gauss-Jordan elimination involves performing rows operations that transform a set of columns into a diagonal matrix.

FIG. 6 shows the matrix in FIG. 5 after Gauss-Jordan elimination has been performed. The all-0 rows in the matrix after Gauss-Jordan elimination have no dependence on the value of the X's. The combination of rows that were XORed together to get the all-0 rows can be kept track of during Gauss-Jordan elimination. In FIG. 6, the first all-0 row is obtained from $M_1 \oplus M_3 \oplus M_5$. This implies that if the MISR bits $M_1$, $M_3$, and $M_5$ are XORed together, all the X's cancel out and the resulting value will have no dependence on the X's. This can be seen by looking back at FIG. 4, and computing: $M_1 \oplus M_3 \oplus M_5 = (X_1 \oplus O_3 \oplus O_8 \oplus O_{13}) \oplus (O_2 \oplus X_3 \oplus O_5 \oplus O_{10} \oplus O_{15}) \oplus (X_1 \oplus O_2 \oplus X_3 \oplus O_{12} \oplus O_{17}) = O_3 \oplus O_5 \oplus O_8 \oplus O_{10} \oplus O_{12} \oplus O_{13} \oplus O_{15} \oplus O_{17}$. As can be seen, after XORing these three bits together, the final equation depends only on non-X values. Similarly, each of the all-0 rows correspond to MISR bit combinations where the X's cancel out. The values of these X-canceled MISR bit combinations are deterministic and can be predicted through simulation. During test, they can be compared with their fault-free values in order to detect errors.

Figure 7:
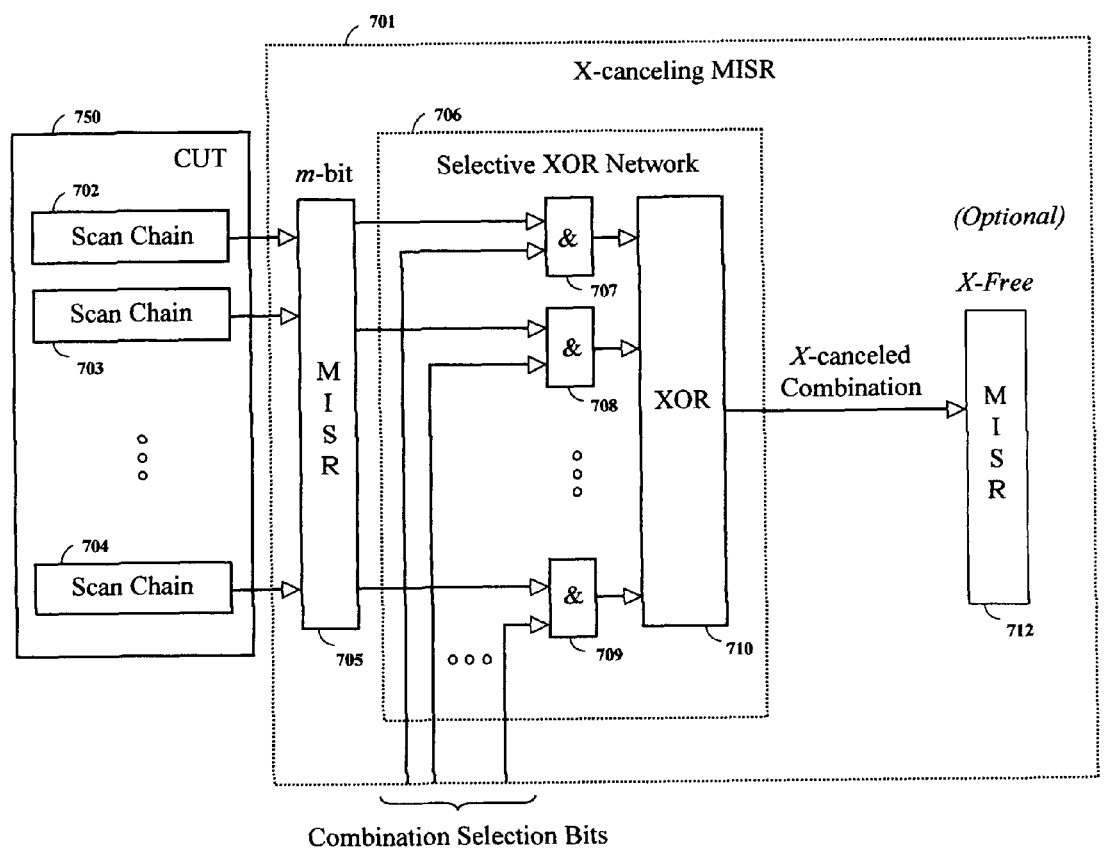
FIG. 7 is a circuit diagram of one embodiment of the present invention for canceling out X's in a MISR signature.

FIG. 7 shows a circuit diagram of a system using the X-canceling MISR 701 in accordance with the present invention. The X-canceling MISR 701 includes multiple scan chains 702-704 in a circuit-under-test (CUT) 750, an m-bit MISR 705, a selective XOR network 706, and optionally includes an X-free MISR 712. The m-bit MISR 705 consists of one or more XOR gates and one or more storage elements such as D flip-flop or D latch. The m-bit MISR 705 can be a conventional MISR shown in FIG. 4, a convolutional compactor shown in FIG. 2, or an X-tolerant MISR shown in FIG. 3. The selective XOR network comprises one AND gate 707-709 for each of the m MISR outputs followed by an XOR network 710. The AND gates are controlled by combination selection bits. The combination selection bits may be wires or buffers directly connected to the tester channels, or they may be driven by a shift register or other sequential circuit that accumulates control bits from the tester channels over multiple clock cycles before selecting the MISR bit combination to XOR together. The output response of the scan chains 702-704, which may contain X's, is compacted by the m-bit MISR 705 to generate a signature after a predetermined number of clock cycles. A linearly dependant combination of MISR bits with respect to the X's is then XORed together using the selective XOR network 706. This cancels out all the X's and produces a deterministic value that can be predicted through simulation and hence can be used for detecting faults. The X-canceled combination value can either be sent back to the tester or optionally be compacted in an X-free MISR 712 for analysis. An example X-free MISR can be similar to the MISR 401 illustrated in FIG. 4. Multiple X-canceled combinations can be generated for each MISR signature and compared with the expected test responses to determine the pass/fail status of the CUT 750.

Figure 8:
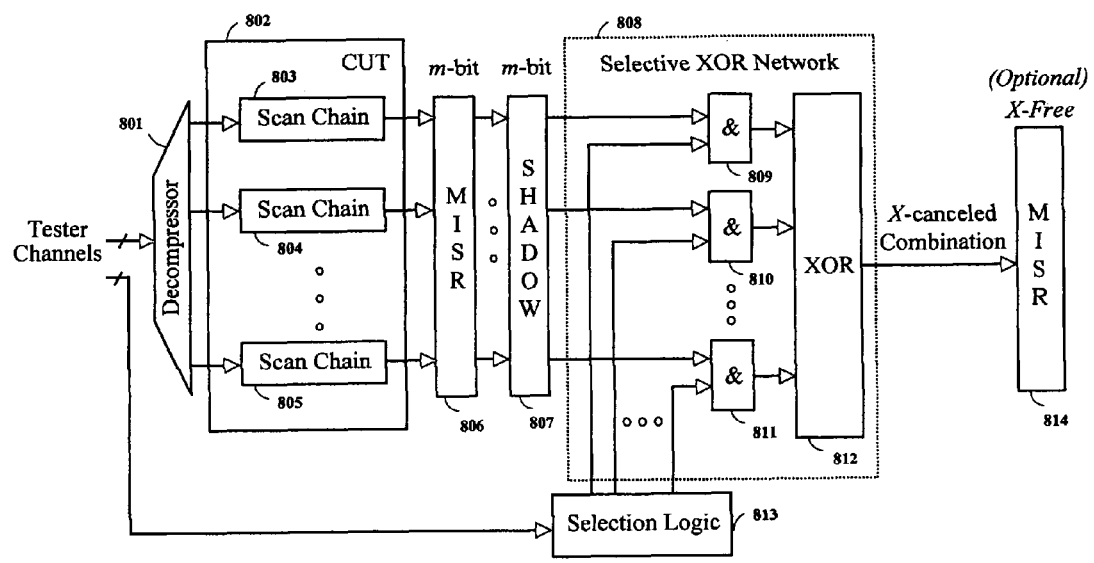
FIG. 8 is a circuit diagram of another embodiment of the present invention which uses a shadow register.

FIG. 8 shows a circuit diagram for another embodiment of an X-canceling MISR in which a shadow register is employed. It includes a decompressor 801, multiple scan chains 803-805 in a circuit-under-test (CUT) 802, an m-bit MISR 806, an m-bit shadow register 807, a selective XOR network 808, an optional X-free MISR 814, and a selection logic block 813. The selective XOR network 808 comprises one AND gate 809-811 for each of the m MISR outputs followed by an XOR network 812. The selection logic block 813 can either just be wires or buffers directly connecting the tester channels to the selective XOR network 808, or a shift register or other sequential circuit that accumulates control bits from the tester over multiple clock cycles before selecting the MISR bit combination to XOR together. The decompressor 801 expands the data coming from the tester channels to load the scan chains 803-805. The m-bit MISR 806 compacts the output response from the scan chains 803-805 until it fills up with X's after a predetermined number of clock cycles. The m-bit MISR 806 can be a conventional MISR shown in FIG. 4, a convolutional compactor shown in FIG. 2, or an X-tolerant MISR shown in FIG. 3. At that point, the MISR signature is transferred to the m-bit shadow register 807, and the m-bit MISR 806 is then reset and can continue to compact output response. In the meantime, the X-canceled combination value is generated for the signature saved in the shadow register 807. The X-canceled combination value can either be sent back to the tester or optionally be compacted in an X-free MISR 814. An example X-free MISR 814 can be similar to the MISR 401 illustrated in FIG. 4. Multiple X-canceled combinations can be generated for each MISR signature and compared with the expected test responses to determine the pass/fail status of the CUT 802.

Having thus described and illustrated specific embodiments of the present invention, it is to be understood that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. An apparatus using an X-canceling multiple-input signature register (MISR) for compacting a test response containing unknowns (X's) in one or more scan cells in a scan-based integrated circuit; the scan cells being connected in series to form M internal scan chains; the X-canceling MISR including one or more selected combination selection bits and being arranged to receive the test response appearing at the scan chain outputs of said M internal scan chains to generate the non-X signature at N external scan outputs for analysis on a tester, where M>N, said apparatus comprising:

(a) an M-bit MISR for receiving the test response appearing at the scan chain outputs of said M internal scan chains prior to receiving said test response in said scan-based integrated circuit to generate a signature after a predetermined number of clock cycles; and (b) a selective XOR network connected to said M-bit MISR for canceling out all unknowns (X's) which appear at the scan chain outputs of said M internal scan chains to generate a non-X signature at said N external scan outputs, wherein said XOR network is arranged to determine the values of said selected combination selection bits of the MISR to generate said non-X signature after said predetermined number of clock cycles, by performing a Gauss-Jordan elimination through symbolic simulation.

2. The apparatus of claim 1, wherein said M-bit MISR further comprises one or more XOR gates and one or more storage elements, such as D flip-flops or D latches.

3. The apparatus of claim 1, wherein said selective XOR network further comprises one or more AND gates followed by an XOR network; wherein each said AND gate takes inputs from one selected said M-bit MISR output and one or more selected combination selection bits.

4. The apparatus of claim 1, further comprising selected combination selection bits in the form of wires or buffers selectively connecting the tester channels to said selective XOR network, or to a shift register or other sequential circuit that accumulates control bits from the tester over multiple clock cycles before selecting the MISR bit combination to XOR together.

5. The apparatus of claim 1, wherein said selected combination selection bits are wires or buffers selectively connecting the tester channels to said M-bit MISR, or to a shift register or other sequential circuit for generating said selected combination selection bits, and wherein said M-bit MISR is selectively a conventional MISR, a convolutional compactor, or an X-tolerant MISR.

6. The apparatus of claim 1, further comprising an X-free MISR coupled to the outputs of said selective XOR network to generate said non-X signature wherein said X-free MISR is a conventional MISR.

7. The apparatus of claim 1, further comprising an M-bit shadow register embedded between said M-bit MISR and said selective XOR network to store the intermediate signature available at the outputs of said M-bit MISR for generating said non-X signature through said selective XOR network.

8. The apparatus of claim 7 wherein said shadow register further comprising a selection logic block so that after said M-bit MISR compacts said output responses from the scan chains until it fills up with X's after a predetermined number of clock cycles, the MISR signature is transferred to the M-bit shadow register and said M-bit MISR is then reset and can continue to compact output response; wherein said selection logic block can be wires or buffers selectively connecting the tester channels to the selective XOR network, or to a shift register or other sequential circuit that accumulates control bits from the tester over multiple clock cycles before selecting the MISR bit combination to XOR together.

9. A method using an X-canceling multiple-input signature register (MISR) for compacting a test response containing unknowns (X's) in one or more scan cells in a scan-based integrated circuit; the scan cells being connected in series to form M internal scan chains; the X-canceling MISR including one or more selected combination selection bits and being arranged to receive the test response appearing at the scan chain outputs of said M internal scan chains to generate the non-X signature at N external scan outputs for analysis on a tester, where M>N, said method comprising:
 (a) using an M-bit MISR for receiving the test response appearing at the scan chain outputs of said M internal scan chains in said scan-based integrated circuit and to generate a signature after a predetermined number of clock cycles; and
 (b) using a selective XOR network connected to said M-bit MISR for canceling out all unknowns (X's) which appear at the scan chain outputs of said M internal scan chains and to generate said non-X signature at said N external scan outputs, wherein said XOR network is arranged to determine the values of said selected combination selection bits of the X-canceling MISR to generate said non-X signature after said predetermined number of clock cycles, by performing a Gauss-Jordan elimination through symbolic simulation.

10. The method of claim 9, wherein said M-bit MISR further comprises one or more XOR gates and one or more storage elements, such as D flip-flops or D latches.

11. The method of claim 9, wherein said selective XOR network further comprises one or more AND gates followed by an XOR network; wherein each said AND gate takes inputs from one selected said M-bit MISR output and said one or more selected combination selection bits.

12. The method of claim 9, further comprising selected combination selection bits in the form of wires or buffers selectively connecting the tester channels to said selective XOR network, or to a shift register or other sequential circuit that accumulates control bits from the tester over multiple clock cycles before selecting the MISR bit combination to XOR together.

13. The method of claim 9, wherein said selected combination selection bits are wires or buffers selectively connecting the tester channels to said M-bit MISR, or to a shift register or other sequential circuit for generating said selected combination selection bits, and, wherein said M-bit MISR is selectively a conventional MISR, a convolutional compactor, or an X-tolerant MISR.

14. The method of claim 9, further comprising an X-free MISR coupled to the outputs of said selective XOR network to generate said non-X signature wherein said X-free MISR is a conventional MISR.

15. The method of claim 9, further comprising an M-bit shadow register embedded between said M-bit MISR and said selective XOR network to store the intermediate signature available at the outputs of said M-bit MISR for generating said non-X signature through said selective XOR network.

16. The method of claim 15 wherein said shadow register further comprising a selection logic block so that after said M-bit MISR compacts said output responses from the scan chains until it fills up with X's after a predetermined number of clock cycles, the MISR signature is transferred to the M-bit shadow register and said M-bit MISR is then reset and can continue to compact output response; wherein said selection logic block can be wires or buffers selectively connecting the tester channels to the selective XOR network, or to a shift register or other sequential circuit that accumulates control bits from the tester over multiple clock cycles before selecting the MISR bit combination to XOR together.

17. In a method for compacting test responses containing unknown (X) values in one or more scan cells in a scan-based integrated circuit using an X-canceling multiple-input signature register (MISR) to produce a known (non-X) signature at N external scan outputs, the scan cells being connected in series to form M internal scan chains, where M>N, the improvement wherein said known (non-X) signature is obtained by including one or more selected combination selection bits to mask out one or more X's of said test responses appearing at the scan chain outputs of said M internal scan chains to said X-canceling MISR, wherein said XOR network is arranged to determine the values of said selected combination selection bits to generate said non-X signature after said predetermined number of clock cycles, by performing a Gauss-Jordan elimination through symbolic simulation.

18. In an apparatus for compacting test responses containing unknown (X) values in one or more scan cells in a scan-based integrated circuit using an X-canceling multiple-input signature register (MISR) to produce a known (non-X) signature at N external scan outputs, the scan cells being connected in series to form M internal scan chains, where M>N, the improvement wherein a known (non-X) signature is obtained by including one or more selected combination selection bits to mask out one or more X's of said test responses appearing at the scan chain outputs of said M internal scan chains to said X-canceling MISR, wherein said XOR network is arranged to determine the values of said selected combination selection bits to generate said non-X signature after said predetermined number of clock cycles, by performing a Gauss-Jordan elimination through symbolic simulation.

19. An apparatus using a compactor and a filter for compacting a test response containing unknowns (X's) in one or more scan cells in a scan-based integrated circuit; the scan cells being connected in series to form M internal scan chains; the compactor including one or more selected combination selection bits appearing at the scan chain outputs of said M internal scan chains for receiving said test response to generate a non-X signature at N external scan outputs for analysis on a tester, where M>N, the compactor being selectively a space compactor, a conventional MISR, a convolutional compactor, or an X-tolerant MISR; the filter being selectively a selective XOR network, a sequential circuit, or a combinational logic network, said apparatus comprising:
  (a) a compactor including said one or more selected combination selection bits appearing at the scan chain outputs of said M internal scan chains for receiving said test response in said scan-based integrated circuit to generate a signature after a predetermined number of clock cycles; and
  (b) a filter connected to said compactor for canceling out all unknowns (X's) which appear at the compactor outputs to generate the non-X signature at said N external scan outputs,
    wherein said filter is arranged to determine the values of said selected combination selection bits of the compactor to generate said non-X signature after said predetermined number of clock cycles, by performing a Gauss-Jordan elimination through symbolic simulation.

20. A method using a compactor and a filter for compacting a test response containing unknowns (X's) in one or more scan cells in a scan-based integrated circuit; the scan cells being connected in series to form M internal scan chains; the compactor including one or more selected combination selection bits appearing at the scan chain outputs of said M internal scan chains for receiving said test response to generate a non-X signature at N external scan outputs for analysis on a tester, where M>N, the compactor being selectively a space compactor, a conventional MISR, a convolutional compactor, or an X-tolerant MISR; the filter being selectively a selective XOR network, a sequential circuit, or a combinational logic network, said method comprising:
  (a) using the compactor including said one or more selected combination selection bits for receiving said test response in said scan-based integrated circuit to generate a signature after a predetermined number of clock cycles; and
  (b) using the filter connected to said compactor for canceling out all unknowns (X's) which appear at the compactor outputs to generate the non-X signature at said N external scan outputs,
    wherein said filter is arranged to determine the values of said selected combination selection bits of the compactor to generate said non-X signature after said predetermined number of clock cycles, by performing a Gauss-Jordan elimination through symbolic simulation.

\* \* \* \* \*